US012772573B2

(12) United States Patent
Roig-Guitart et al.

(10) Patent No.: US 12,772,573 B2
(45) Date of Patent: Oct. 20, 2026

(54) ELECTRONIC DEVICE AND A CIRCUIT INCLUDING A POWER TRANSISTOR

(71) Applicant: SEMICONDUCTOR COMPONENTS INDUSTRIES, LLC, Scottsdale, AZ (US)

(72) Inventors: Jaume Roig-Guitart, Oudenaarde (BE); Alexander Viktorovich Bolotnikov, Niskayuna, NY (US); Martin Domeij, Sollentuna (SE); Jimmy Robert Hannes Franchi, Enköping (SE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 336 days.

(21) Appl. No.: 18/632,954

(22) Filed: Apr. 11, 2024

(65) Prior Publication Data

US 2025/0324769 A1 Oct. 16, 2025

(51) Int. Cl.
*H10D 89/60* (2025.01)
*H10D 84/80* (2025.01)

(52) U.S. Cl.
CPC ......... *H10D 89/811* (2025.01); *H10D 84/811* (2025.01); *H10D 89/611* (2025.01)

(58) Field of Classification Search
CPC ....... H03K 17/0822; H03K 2217/0027; H10D 89/811; H10D 89/611; H10D 62/8325; H10D 84/811
USPC .......................................................... 257/360
See application file for complete search history.

(56) References Cited

U.S. PATENT DOCUMENTS

| | | | |
|---|---|---|---|
| 5,432,471 | A | 7/1995 | Majumdar et al. |
| 5,844,760 | A | 12/1998 | Kumagai et al. |
| 6,339,236 | B1 | 1/2002 | Tomii et al. |
| 10,818,786 | B1 | 10/2020 | Udrea et al. |

(Continued)

FOREIGN PATENT DOCUMENTS

| | | | |
|---|---|---|---|
| EP | 3570439 | A1 | 11/2019 |
| JP | 2010040814 | A | 2/2010 |
| WO | 2023162294 | A1 | 8/2023 |

OTHER PUBLICATIONS

International Search Report and Written Opinion for PCT/US2024/029269, mailed Dec. 23, 2024, pp. 1 to 16.

(Continued)

*Primary Examiner* — Pritham D Prabhakher
(74) *Attorney, Agent, or Firm* — Abel Schillinger, LLP

(57) ABSTRACT

A circuit and an electronic device can include a first transistor, a second transistor, a third transistor, and a resistor. Each of the first and the second transistors can be an IGFET. Drains of the first and second transistors can be electrically coupled to each other, gates of the first and second transistors can be electrically coupled to each other, sources of the first and third transistors, and a first terminal of the resistor can be electrically coupled to one another, a source of the second transistor, a gate of the third transistor, and a second terminal of the resistor can be electrically coupled to one another, and a source of the third transistor and the second terminal of the resistor can be electrically coupled to each other. The circuit and electronic device can react more quickly to a short-circuit event, thus, increasing short circuit withstand time.

20 Claims, 6 Drawing Sheets

(56) References Cited

U.S. PATENT DOCUMENTS

| | | | | |
|---|---|---|---|---|
| 12,068,408 | B2 * | 8/2024 | De Vleeschouwer | G01R 19/0092 |
| 12,483,239 | B2 * | 11/2025 | Udrea | H03K 17/0822 |
| 2011/0193171 | A1 * | 8/2011 | Yamagiwa | H10D 30/475 257/355 |
| 2013/0249602 | A1 * | 9/2013 | Mauder | H10D 30/64 257/341 |
| 2016/0307886 | A1 * | 10/2016 | Roberts | H10D 89/60 |
| 2018/0069544 | A1 * | 3/2018 | Mauder | H03K 17/567 |
| 2025/0211226 | A1 * | 6/2025 | Udrea | H03K 17/0822 |

OTHER PUBLICATIONS

Kudoh et al., "Current Sensing IGBT Structure with Improved Accuracy", ISPSD; IEEE; 1995; pp. 119-122.
Iwamuro et al., "A New Vertical IGBT Structure with a Monolithic Over-Current, Over-Voltage, and Over-Temperature Sensing and Protecting Circuit", IEEE Electron Device Letters; vol. 16, No. 9; 1995; pp. 399-401.
Seki et al., "A New IGBT with a Monolithic Over-Current Protection Circuit", ISPSD; IEEE; 1994; pp. 31-35.
Shen et al., "Monolithic Integration of the Vertical IGBT and Intelligent Protection Circuits", ISPSD; IEEE; 1996; pp. 295-298.
Shimizu et al., "A High Performance Intelligent IGBT with Overcurrent Protection", ISPSD; IEEE; 1994; pp. 37-41.
Yun et al., "A Monolithic Current Limiting Power Mosfet", IEEE; 1995; pp. 71-74.

* cited by examiner

ELECTRONIC DEVICE AND A CIRCUIT INCLUDING A POWER TRANSISTOR

FIELD OF THE DISCLOSURE

The present disclosure relates to electronic devices and circuits, and more particularly, to electronic devices and circuits that include power transistors.

RELATED ART

Transistors can be designed to operate at high voltage and high current density. Some semiconductor materials, such as monocrystalline Si, may be limited in device performance or require more complex designs when needing to withstand high voltage and current simultaneously during operation. SiC can be used to fabricate transistors (e.g., insulated-gate field-effect transistors (IGFETs)) that operate at higher voltages and current compared to conventional Si power transistors. The SiC IGFET has a relatively shorter Short-Circuit Withstand Time (SCWT) as compared to Si insulated gate bipolar transistors (IGBTs) due to the increased power density in wide bandgap materials. The SCWT test is used to determine how long a device can withstand a short circuit condition in application, an event during which the device is simultaneously exposed to high drain-source voltage and high drain-source current, leading to severe device heating and potentially failure, thus compromising system operation. In traction applications, this can lead to a battery short circuit, which may result in a blown main battery fuse and loss of vehicular power. A need exists for an electronic device and circuit with improved SCWT compared to conventional attempts.

BRIEF DESCRIPTION OF THE DRAWINGS

Implementations are illustrated by way of example and are not limited in the accompanying figures.

Figure 1:
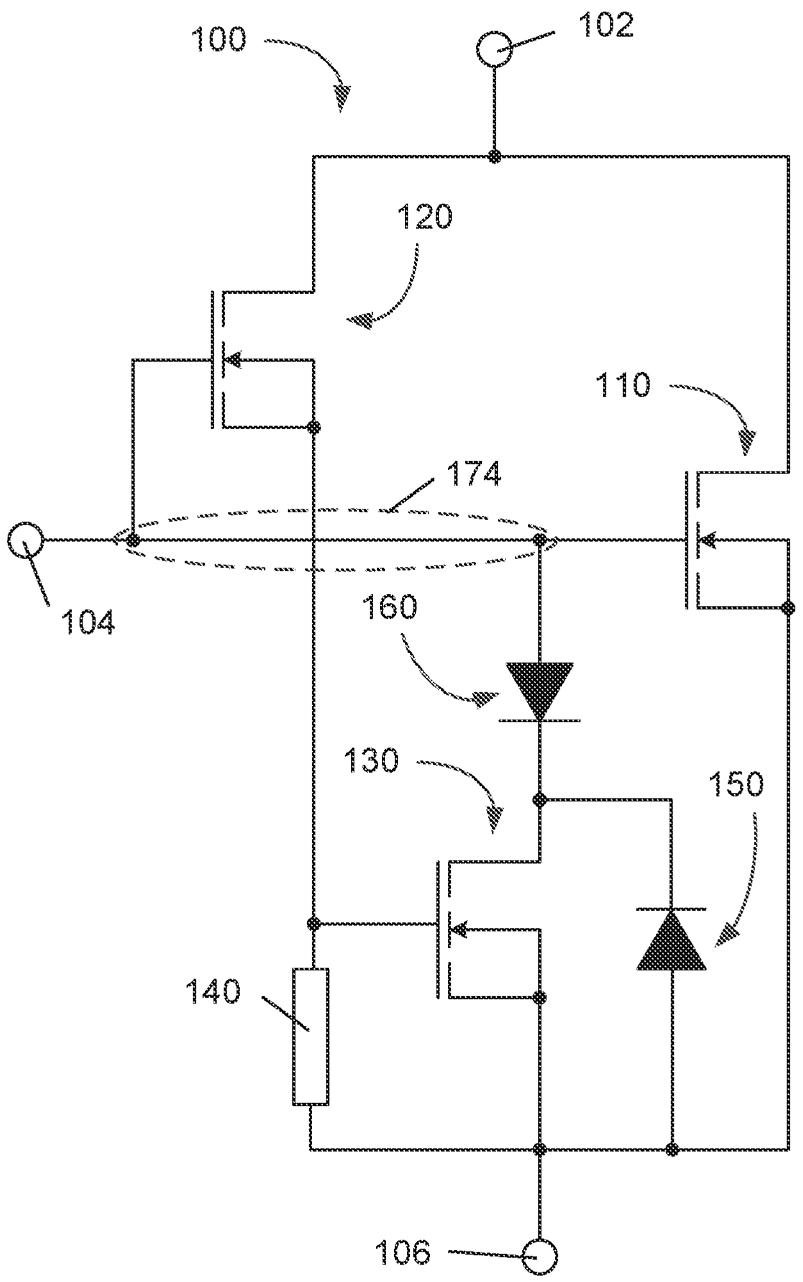
FIG. 1 includes an illustration of a circuit diagram for a circuit that includes a power transistor.

Skilled artisans appreciate that elements in the figures are illustrated for simplicity and clarity and have not necessarily been drawn to scale. For example, the dimensions of some of the elements in the figures may be exaggerated relative to other elements to help to improve understanding of implementations of the invention.

DETAILED DESCRIPTION

The following description in combination with the figures is provided to assist in understanding the teachings disclosed herein. The following description will focus on specific implementations and implementations of the teachings. This focus is provided to assist in describing the teachings and should not be interpreted as a limitation on the scope or applicability of the teachings. However, other implementations can be used based on the teachings as disclosed in this application.

As used in this specification, length and width are measured in directions along or parallel to a major surface of a substrate or a semiconductor layer. Depth, height, and thickness are measured in directions perpendicular to the major surface of the substrate or the semiconductor layer.

The term "electrically coupled" is intended to mean a connection, linking, or association of two or more electronic components, circuits, systems, or any combination of: (1) at least two electronic components, (2) at least two circuits, (3) at least one electronic component and at least one circuit, or (4) at least one system in such a way that a signal (e.g., current, voltage, or optical signal) may be partly or completely transferred from one to another. A subset of "electrically coupled" can include an electrical connection between two electronic components. In a circuit diagram, a node corresponds to an electrical connection between the electronic components. Thus, an electrical connection is a specific type of electrical coupling; however, not all electrical couplings are electrical connections. Other types of electrical coupling include capacitive coupling, resistive coupling, and inductive coupling.

The terms "horizontal," "lateral," and their variants are in directions along or parallel to a major surface of a substrate or semiconductor layer, and the terms "vertical," "height," "depth," and their variants are in directions perpendicular to a major surface of the substrate or the semiconductor layer. Two objects that are laterally offset can be at the same or different elevations.

The term "metal" or any of its variants is intended to refer to a material that includes an element that is within any of the Groups 1 to 12, or, within Groups 13 to 16, an element that is along or below a line defined by atomic numbers 13 (Al), 31 (Ga), 50 (Sn), 51 (Sb), and 84 (Po). Neither Si nor Ge is a metal.

The term “normal operation” and “normal operating state” refer to conditions under which an electronic component or device is designed to operate. The conditions may be obtained from a data sheet or other information regarding voltages, currents, capacitance, resistance, or other electrical conditions. Thus, normal operation does not include operating an electrical component or device well beyond its design limits.

The terms “overlap,” “underlap,” and their variants refer to at least portions of at least two layers, at least two region, or at least two other features or any combination of a layer, a region, and another feature that lie along a vertical line that is perpendicular to a plane defined by a major surface. Portions of layers, regions, or other features that overlap or underlap each other may or may not be in physical contact with each other.

The term “pn diode” refers to a diode that is at a junction of a p-type doped semiconductor material and an n-type doped semiconductor material. The term “Schottky diode” refers to a diode that is at a junction of a semiconductor material and a conductive metal-containing material.

The term “power transistor” is a transistor that has a drain current of at least 1 A when the power transistor is in an on-state.

The term “semiconductor base material” refers to the principal material within a semiconductor substrate, region, or layer, and does not refer to any dopant within the semiconductor substrate, region, or layer. An aluminum-doped SiC layer has SiC as the semiconductor base material, and a C-doped GaN layer has GaN as the semiconductor base material.

The terms “on,” “overlying,” and “over” may be used to indicate that two or more elements are in direct physical contact with each other. However, “over” may also mean that two or more elements are not in direct contact with each other. For example, “over” may mean that one element is above another element, but the elements do not contact each other and may have another element or elements between the two elements.

The terms “comprises,” “comprising,” “includes,” “including,” “has,” “having” or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, “or” refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of “a” or “an” is employed to describe elements, components and other features described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for such more than one item.

The use of the word “about,” “approximately,” or “substantially” is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A circuit and electronic device can be formed that reacts quickly to a short-circuit event. The circuit and electronic device can include a power transistor, a sense transistor that senses current flowing through the drain and source terminals, and a protection transistor. A protection transistor can be controlled by the amount of current flowing through the sense transistor and a resistor coupled between the gate and the source of the protection transistor. At high currents, the voltage drop across the resistor may be equal to or above the threshold voltage of the protection transistor, thus turning it on. This will result in a decrease in the $V_{DS}$ of the protection transistor, reducing Vas of the power transistor, and resulting in a reduction of the drain current. A protection diode is optional and can be used to keep the voltage across the gate dielectric of the power transistor no greater than a maximum limit such that the protection diode reaches its breakdown voltage before the gate dielectric is damaged. A blocking diode is optional and can be used to prevent or substantially reduce current that would flow from the source terminal to the gate terminal when the power transistor is off and Vas for the power transistor is supplied a negative value.

In an aspect, an electronic device can include a first transistor including a drain region, a source region, and a gate electrode; a second transistor including a drain region, a source region, and a gate electrode; a third transistor including a source region and a gate electrode; and a resistor including a first terminal and a second terminal. Each of the first transistor and the second transistor can be an IGFET. The drain region of the first transistor and the drain region of the second transistor can be electrically coupled to each other, the gate electrode of the first transistor and the gate electrode of the second transistor can be electrically coupled to each other; the source region of the first transistor, the source region of the third transistor, and the first terminal of the resistor can be electrically coupled to one another and the source region of the second transistor, the gate electrode of the third transistor, and the second terminal of the resistor can be electrically coupled to one another.

In another aspect, an electronic device can include a first transistor including a drain region, a source region, and a gate electrode; a second transistor including a drain region, a source region, and a gate electrode; a third transistor including a drain region, a source region, and a gate electrode; a resistor including a first terminal and a second terminal; a first diode including an anode and a cathode; and a second diode including an anode and a cathode. Each of the first transistor and the second transistor can be an IGFET and may have a SiC semiconductor base material, and the third transistor can be a lateral insulated-gate field-effect transistor. The drain region of the first transistor and the drain region of the second transistor can be electrically coupled to each other, the gate electrode of the first transistor, the gate electrode of the second transistor, and the anode of the first diode can be electrically coupled to one another, the source region of the first transistor, the source region of the third transistor, the anode of the second diode, and the first terminal of the resistor can be electrically coupled to one another, the source region of the second transistor, the gate electrode of the third transistor, and the second terminal of the resistor can be electrically coupled to one another, and the drain region of the third transistor, the cathode of the first diode, and the cathode of the second diode can be electrically coupled to one another.

In a further aspect, a circuit can include a first transistor including a drain, a source, and a gate; a second transistor including a drain, a source, and a gate; a third transistor including a drain, a source, and a gate; and a resistor including a first terminal and a second terminal. Each of the first transistor and the second transistor can be an IGFET. The drain of the first transistor and the drain of the second transistor can be electrically coupled to each other, the gate of the first transistor and the gate of the second transistor can be electrically coupled to each other, the source of the first transistor, the source of the third transistor, and the first terminal of the resistor can be electrically coupled to one another, and the source of the second transistor, the gate of the third transistor, and the second terminal of the resistor can be electrically coupled to one another.

FIG. 1 includes a circuit diagram of a circuit 100 that includes a power transistor 110. Other electrical circuit elements in the circuit 100 can help to protect the power transistor 110 during an over-current event and to protect a gate dielectric layer within the power transistor 110 from an overvoltage event. A drain terminal 102 is electrically coupled to a drain of the power transistor 110, a gate terminal 104 is electrically coupled to a gate of the power transistor 110, and a source terminal 106 is electrically coupled to a source of the power transistor 110. During normal operation of the power transistor 110, it is on when the gate-to-source voltage ($V_{GS110}$) is greater than the threshold voltage ($V_{TH110}$) of the power transistor 110, and current flows from the drain terminal 102 to the source terminal 106. The power transistor 110 is off when $V_{GS110}$ is less than $V_{TH110}$, and no or an insignificant leakage current flows through the drain terminal 102 and the source terminal 106. Without the other electrical circuit elements, an over-current event, e.g., a short circuit event where the power transistor 110 is simultaneously exposed to high drain-to-source voltage and high current flowing through the power transistor 110, can cause a failure of the power transistor 110 due to insufficient limiting of the power dissipation in the power transistor 110.

The circuit 100 can further include a transistor 120, a transistor 130, and a resistor 140. The transistor 120 senses current flowing when the power transistor 110 and the transistor 120 are on, and the transistor 120 is referred to hereinafter as "SenseFET 120." The transistor 130 protects the power transistor 110 from over-current, and the transistor 130 is referred to hereinafter as "protection transistor 130."

The SenseFET 120 includes a drain electrically coupled to the drain of the power transistor 110, a gate coupled to the gate of the power transistor 110, and a source electrically coupled to a gate of the protection transistor 130 and a terminal of the resistor 140. The protection transistor 130 includes a drain electrically coupled to the gate of the power transistor 110 and the gate of the SenseFET 120, and a source electrically coupled to the source of the power transistor 110 and the other terminal of the resistor 140. The terminal of the resistor 140 electrically coupled to the gate of the protection transistor 130 can be referred to as the "gate-side terminal," and the terminal of the resistor 140 electrically coupled to the source of the protection transistor 130 can be referred to as the "source-side terminal."

The transistors 110 and 120 can have active regions that are within a semiconductor material. In an implementation, the semiconductor material can include monocrystalline SiC. The SiC can be a 3C, 4H, or 6H polytype. In the same or different implementation, other than area occupied by and the effective channel widths of the transistors 110 and 120, the transistors 110 and 120 can have substantially the same construction. Each of the transistors 110 and 120 can be an IGFET. The construction of the transistors 110 and 120 are illustrated in subsequent figures and are described later in this specification. The transistors 110 and 120 can be within the same die.

The area occupied by the SenseFET 120 can be less than 10% of the area occupied by the power transistor 110. The area occupied by the SenseFET 120 may be less than 1% of the area occupied by the power transistor 110. In any of the foregoing implementations, the area occupied by the SenseFET 120 may be at least $1\times10^{-5}$ times the area occupied by the power transistor 110.

A transistor can include a single transistor structure or a plurality of transistor structures. For the plurality of transistor structures, the drain regions or drain electrodes are electrically connected to one another; the gate electrodes are electrically connected to one another; and the source regions or source electrodes are electrically connected to one another. When on, a transistor structure has a channel region, where the channel length is measured as a distance from a source region edge to whichever is closer of a drain region or a drift region, and the channel width is measured in a direction perpendicular to the channel length. For an IGFET, the channel width is in a direction parallel to the die surface.

For the transistor that includes a single transistor structure, the effective channel width of the transistor is the channel width of the transistor structure. For the transistor that includes a plurality of transistor structures, the effective channel width of the transistor is the sum of the channel widths of the transistor structures. With respect to effective channel width, the effective channel width of the SenseFET 120 can be less than 10% of the effective channel width of the power transistor 110. The effective channel width of the SenseFET 120 may be less than 1% of the effective channel width of the power transistor 110. In any of the foregoing implementations, the effective channel width of the SenseFET 120 may be at least $1\times10^{-5}$ times the effective channel width of the power transistor 110.

When the voltage difference between the gate terminal 104 and the source terminal 106 is greater than $V_{TH110}$, the power transistors 110 turns on and current flows through the power transistor 110. The voltage difference may also be greater than the threshold voltage of the SenseFET 120 ($V_{TH120}$), the SenseFET 120 turns on and current flows through the SenseFET 120 and the resistor 140. The gate-to-source voltage for the protection transistor 130 ($V_{GS130}$) is the same or approximately the same as the voltage drop across the resistor 140. During normal operation, $V_{GS130}$ is less than the threshold voltage of the protection transistor 130 ($V_{TH130}$) and the protection transistor 130 is off.

During an over-current event, current flowing through the resistor 140 increases, causing a voltage drop across the resistor 140, and hence, the voltage on the gate of the protection transistor 130 increases. When $V_{GS130}$ is greater than $V_{TH130}$, the protection transistor 130 turns on, and the potential on the gate node 174 (illustrated with a dashed line) can be pulled closer to the potential of the source terminal 106. As the voltage between the gate node 174 and the source terminal 106 reduces, current flowing though the power transistor 110 and the SenseFET 120 decreases. Thus, the protection transistor 130 helps to limit the current and protect the power transistor 110 during an over-current event, such as a short circuit.

The resistor 140 can have a resistance in a range from 1 ohm to 100 ohms. In another implementation, the resistor 140 can have a resistance in a range from 1 ohm to 20 ohms, depending on how much current is designed to flow through the SenseFET 120 before the protection transistor 130 turns on. Thus, resistance of the resistor 140 can be selected to turn protection transistor 130 on for a particular amount of current flowing through the SenseFET 120. The protection transistor 130 has an on-state resistance ($R_{DSON}$) that can be in a range from 0.1 ohm to 100 ohms. In another implementation, the protection transistor 130 can have a $R_{DSON}$ in a range from 0.1 ohm to 20 ohms, which can allow more current to flow through the protection transistor 130 to allow the voltage on the gate node 174 to reduce more quickly. The resistance of the resistor 140 and the $R_{DSON}$ for the protection transistor 130 can be the same or significantly different from each other.

The circuit 100 can further include diodes 150 and 160. Each of the diodes 150 and 160 is not required in all implementations. The protection diode 150 includes an anode electrically coupled to sources of the transistors 110 and 130 and the source-side terminal of the resistor 140, and an cathode electrically coupled to the drain of the protection transistor 130 and the gate of the power transistor 110. The diode 150 helps to protect the gate dielectric of the power transistor 110, and, thus, the diode 150 is referred to hereinafter as a protection diode. The protection diode 150 can have a breakdown voltage less than the maximum voltage rating for Vas of the power transistor 110. The maximum voltage rating can be obtained from a product data sheet for a product including the power transistor 110. In an implementation, the maximum voltage rating can be at most 50 V. In another implementation, the gate dielectric may have the maximum voltage rating of at most 25 V. Skilled artisans will be able to determine a breakdown voltage for the protection diode 150 that provides sufficient protection of the gate dielectric of the power transistor 110.

The diode 160 includes an anode electrically coupled to the gates of the transistors 110 and 120 and a cathode electrically coupled to the drain of the protection transistor 130. $V_{GS110}$ may have a negative value when the power transistor 110 is turned off. The diode 160 helps to ensure current does not flow through the drain of the protection transistor 130 or, if present, through the cathode of the protection diode 150 when the potential of the terminal 104 is lower than the potential of the terminal 106 when the transistors 110 and 120 are off. Thus, the diode 160 is referred to hereinafter as a blocking diode. The blocking diode 160 is not needed if the potential of the terminal 104 does not go below the potential of the terminal 106, such as conditions where $V_{GS110}$ is always at least 0 V. The breakdown voltage of the blocking diode 160 is greater than the absolute value of the potential difference between the terminals 104 and 106 when the power transistor 110 is off. The breakdown voltage of the blocking diode 160 may be higher than the maximum negative Vos rating of the power transistor 110. When the potential difference between the terminals 104 and 106 is no less than −2 V (|(potential difference)|≤2 V), the transistor 110 is off, the breakdown voltage of the blocking diode 160 may be at most 5 V. The breakdown voltage of the blocking diode 160 can be less than the breakdown voltage of the protection diode 150.

Many of the electric couplings can be electrical connections. In the implementation illustrated in FIG. 1, the black dots represent nodes and electrical connections between parts of the electrical circuit elements. If the blocking diode 160 is not present, the drain of the protection transistor 130 can be electrically connected to the gates of the transistors 110 and 120.

The circuit 100 is well suited for an electronic device that has a relatively short SCWT. For example, a SiC IGFET can have a substantially shorter SCWT as compared to a Si IGBT of the same voltage rating. For example, the IGFET may have a SCWT that is less than 10 μs, whereas the IGBT can have a SCWT that is several tens of μs. Thermal detection of an over-current event can be acceptable for a Si IGBT but may be too slow for use with a SiC IGFET. The circuit 100 reacts quicker to an over-current event and reduces the likelihood of damage to the power transistor 110. Examples demonstrate improvements with the circuit and are addressed with respect to FIGS. 10 to 12 later in this specification.

The power transistor 110 can include an active region within a variety of different semiconductor base materials, such as Si, SiC, GaN, diamond, other III-V semiconductor compounds and II-VI semiconductor compounds. Much of the description is based on the power transistor 110 having an active region within a SiC semiconductor base material. However, other semiconductor base materials can be used in other implementations.

Figure 2:
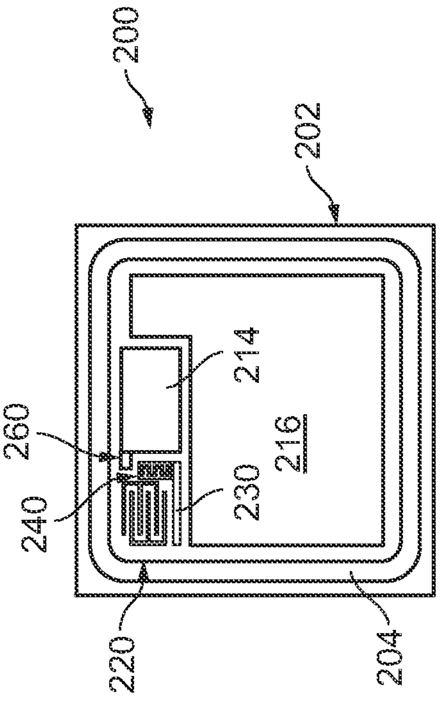
FIG. 2 includes an illustration of a top view of a die including the circuit of FIG. 1.

FIG. 2 includes a schematic top view of conceptual design of a die 200 that includes the circuit 100 in FIG. 1. The die 200 has a peripheral edge 202 and an edge termination 204 that surrounds at least some of the electronic circuit elements in the circuit 100. In practice, the edge termination 204 is spaced apart from the peripheral edge 202 and is narrower than illustrated in FIG. 2. The die 200 includes a gate pad 214 and a source pad 216 that can correspond to the gate terminal 104 and the source terminal 106 in FIG. 1. Although not illustrated in FIG. 2, the die 200 can include back side metal that can correspond to the drain terminal 102 in FIG. 1. FIG. 2 includes transistors structures 220 that can correspond to the SenseFET 120 in FIG. 1, a protection transistor region 230 that can correspond to the protection transistor 130 in FIG. 1, a resistor 240 that can correspond to the resistor 140 in FIG. 1, and a diode region 260 that can correspond to the blocking diode 160, the protection diode 150, or both diodes in FIG. 1. Transistor structures that make up the power transistor 110 in FIG. 1 are present but not seen in FIG. 2 because the transistor structures of the power transistor 110 are overlapped by the source pad 216. The ratio of the areas occupied by the SenseFET 120 and the power transistor 110 was described earlier in this specification.

Figure 3:
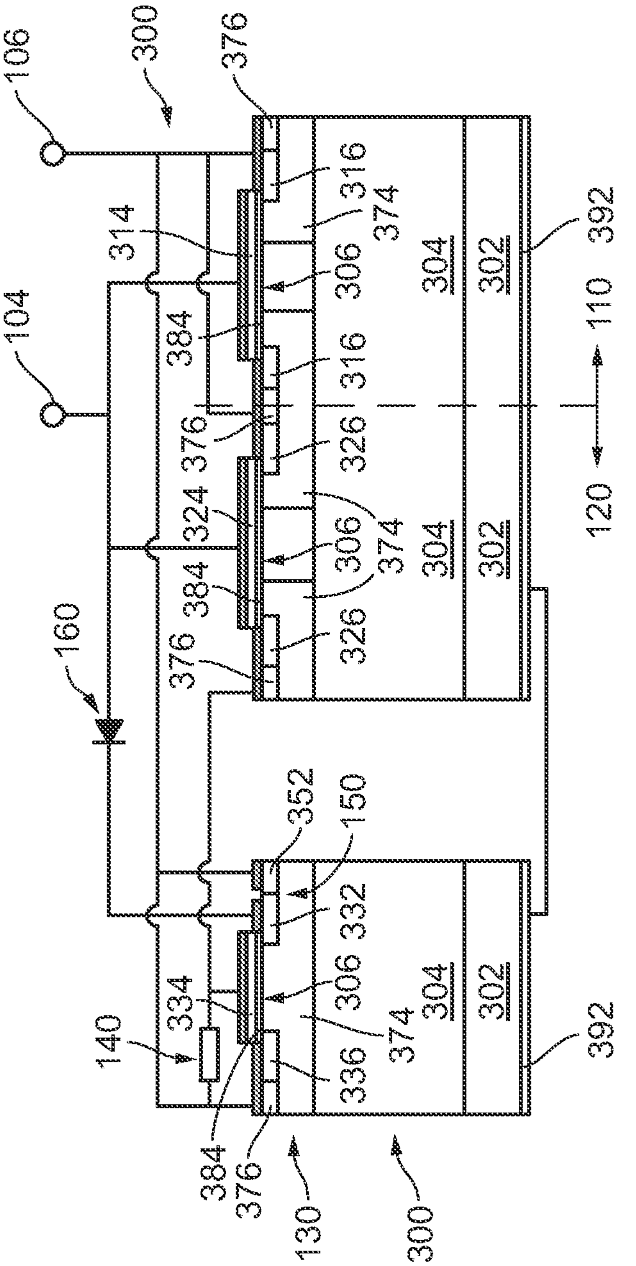
FIG. 3 includes an illustration of a hybrid circuit schematic and cross-sectional view of a portion of the die of FIG. 2 that includes electronic components of the circuit of FIG. 1.

FIG. 3 includes a hybrid of a cross-sectional view and a partial circuit schematic that illustrates a physical design for electronic circuit elements formed at least partly within a workpiece 300. The workpiece 300 can be in the form of a wafer before the wafer is singulated into dies. The workpiece 300 can include a substrate 302 and a semiconductor layer 304. The substrate 302 can be heavily doped and be the drain region for the power transistor 110 and the SenseFET 120. Portions of the semiconductor layer 304 can be drift regions for the power transistor 110 and the SenseFET 120. The protection transistor 130 is a lateral IGFET in this implementation, so the substrate 302 and the semiconductor layer 304 provide mechanical support for the protection transistor 130; however, the substrate 302 and the semiconductor layer 304 are not parts of the active region for the protection transistor 130. The substrate 302 and the semiconductor layer 304 have the same conductivity type, such as n-type. The substrate 302 can be heavily doped and have a dopant concentration of at least $1\times10^{18}$ atoms/$cm^3$. The substrate 302 may have a dopant concentration of at most $1\times10^{21}$ atoms/$cm^3$.

In an implementation, the substrate 302 and the semiconductor layer 304 can have the same semiconductor base material, such as SiC. In another implementation, the substrate 302, the semiconductor layer 304, or both may have a semiconductor base material other than SiC. The semiconductor layer 304 can be epitaxially grown from the substrate 302 and doped during or after growth. The semiconductor layer 304 can have a thickness in a range from 1.2 microns to 200 microns. The semiconductor layer 304 can have the same conductivity type as the semiconductor material within the substrate 302. In an implementation, the semiconductor layer 304 is n-type doped. The semiconductor layer 304 can have a lower dopant concentration as compared to the semiconductor material within the substrate 302. The average dopant concentration of the semiconductor layer 304 can be in a range from $1\times10^{14}$ atoms/$cm^3$ to $1\times10^{17}$ atoms/$cm^3$. The actual thickness and average dopant concentration of the semiconductor layer 304 can be selected to achieve a desired $R_{DSON\_SPECIFIC}$ and breakdown voltage for the power transistor 110.

The average dopant concentration of the semiconductor layer 304 before any further doping, such as for a body region or a source region, is referred to herein as the original dopant concentration. The uppermost surface of the semiconductor layer 304 is a major surface 306. Subsequent doping and patterning, if any, within the semiconductor layer 304 will be performed along or extend from the major surface 306.

Source regions 316, 326, and 336, a drain region 332, an anode region 352, body regions 374, and body contact regions 376 are formed within portions the semiconductor layer 304. The drain region 332 is also a cathode region for the protection diode 150 in the implementation illustrated. Other source regions, drain regions, anode regions, body regions, and body contact regions may be present within the workpiece but are not illustrated in FIG. 3. The source regions 316, 326, and 336 and the drain region 332 have the same conductivity type as the substrate 302, and the anode region 352, the body regions 374, and the body contact regions 376 have a conductivity type opposite the substrate 302. In an implementation, the source regions 316, 326, and 336 and the drain region 332 are n-type, and the anode region 352, the body regions 374 and the body contact regions 376 are p-type.

Each of the source regions 316, 326, and 336, the drain region 332, the anode region 352, the body regions 374, and the body contact regions 376 can have a surface portion that is 10% of the thickness for the corresponding region. Each of the surface portions can have an average dopant concentration that is higher than the average dopant concentration of the semiconductor layer 304. The source regions 316, 326, and 336, the drain region 332, the anode region 352, and the body contact regions 376 can have an average dopant concentration of at least $1\times10^{18}$ atoms/$cm^3$. Thus, ohmic contacts can be made between a metal-containing material and each of the source regions 316, 326, and 336, the drain region 332, the anode region 352, and the body contact regions 376. The source regions 316, 326, and 336, the drain region 332, the anode region 352, and the body contact regions 376 may have an average dopant concentration of at most $3\times10^{21}$ atoms/$cm^3$.

The average dopant concentration of the body regions 374 can be selected to achieve a desired $V_{TH}$ for the power transistor 110. In an implementation, the upper portion of the body region includes channel regions for the transistors. The channel regions of the body regions 374 can have an average dopant concentration in a range from $5\times10^{15}$ atoms/$cm^3$ to $5\times10^{17}$ atoms/$cm^3$. In another implementation (not illustrated), other doped regions can be formed to adjust the $V_{TH}$ for the power transistor 110 or the SenseFET 120. Such other doped regions may be between the body regions 374 and under gate electrodes 314 and 324 and have an average dopant concentration that is between the average dopant concentrations of the body regions 374 and the body contact regions 376.

If needed or desired, a $V_{TH}$ adjustment surface (the portion next to the major surface 306) doped region can be used to adjust $V_{TH}$ for the protection transistor 130. The $V_{TH}$ adjustment doped region can underlie a gate electrode 334 and be located between the source region 336 and the drain region 332 of the protection transistor 130. The $V_{TH}$ adjustment doped region has a conductivity type opposite the substrate 302 and has an average dopant concentration that is typically but not necessarily less than an average dopant concentration for the body region 374 of the protection transistor. In an implementation, the average dopant concentration for the $V_{TH}$ adjustment doped region can be in a range from $1\times10^{16}$ atoms/$cm^3$ to $1\times10^{18}$ atoms/$cm^3$.

Any one or more of the previously described doped regions can be formed using a single implant or a plurality of implants to achieve a desired depth and dopant concentration profile.

In an implementation, all doped regions can be formed within the semiconductor layer 304 whereafter an activation anneal is performed. In a particular implementation, the semiconductor layer 304 includes monocrystalline SiC, and dopants within the doped regions can be activated during an anneal at a temperature in a range of 1500° C. to 2000° C. and a soak time in a range of 5 minutes to 120 minutes. In another implementation, the semiconductor base material is a semiconductor element or another semiconductor compound (other than SiC). Thus, doping concentrations, implantation energies, type of conductivity, the activation anneal temperature, soak time, and other fabrication steps may differ for other semiconductor base materials.

A gate dielectric layer 384 can be formed along the major surface 306 and over the semiconductor layer 304, the source regions 316, 326, and 336, the drain region 332, the anode region 352, the body regions 374, and the body contact regions 376. The gate dielectric layer 384 may include a silicon dioxide, an oxynitride or any other suitable dielectric or combination thereof. In an implementation, the gate dielectric layer can have a thickness in a range from 20 nm to 95 nm.

A gate conductive layer can be deposited over the gate dielectric layer 384. The gate conductive layer can include a single film or a plurality of films, where the single film or any of the films within the plurality of films can include a doped semiconductor layer or a conductive metal-containing material. The gate conductive layer can have a thickness in a range from 20 nm to 1000 nm. In a particular implementation, the gate conductive layer can be n-type doped polycrystalline Si (polySi). The gate conductive layer can be patterned to form gate electrodes 314, 324, and 334. The gate electrodes 314, 324, and 334 may or may not be silicided.

Further processing can be performed to form a finished electronic device. Such further processing can include forming one or more interlayer dielectric (ILD) layers and one or more interconnect levels. Conductive vias can be formed to electrically connect interconnects to the gate electrodes 314, 324, and 334 and doped regions in the semiconductor layer 304 and electrically connect interconnects at different interconnect levels. In another implementation, conductive vias are not used, and interconnects can contact the gate electrodes 314, 324, and 334 and doped regions in the semiconductor layer 304. A passivation layer, a polyimide layer, or both may be formed and patterned to cover edge termination and expose parts of one or more source pads electrically coupled to the body contact regions 376 and the source regions 326 and 336 and one or more gate pads electrically coupled to the gate electrodes 314 and 324. The backside (opposite the major surface 306) of the substrate 302 can be thinned (e.g., ground or etched) to remove some or most of the substrate 302. A backside metal or metal alloy 392 is attached or formed along the surface of the remaining portion of the substrate 302. The backside metal or metal alloy 392 can be a drain terminal for the electronic device.

The dark bands over the gate electrodes 314, 324, and 334 and doped regions not covered by the gate electrodes 314, 324, and 334 represent electrical contacts between the gate electrodes 314, 324, and 334 and such doped regions and other portions of the circuit. The source regions 316 and the body contact regions 376 within the power transistor 110 are electrically connected to one another by the source contact; the source regions 326 and the body contact regions 376 within the SenseFET 120 are electrically connected to one another by the source contact; and the source region 336 and the body contact regions 376 within the protection transistor 130 are electrically connected to one another. The drain region 332 (that is also a cathode region) and the anode region 352 are in contact with each other and form a pn diode for the protection diode 150, and thus, the drain region 332 and the anode region 352 do not share the same contact.

The constructions of the power transistor 110 and the SenseFET 120 are substantially identical except for areas occupied by and the effective channel widths of the transistors 110 and 120. For the transistors 110 and 120, the dopant and dopant concentration profile for the body regions 374 are substantially identical, the dopant and dopant concentration profile for the body contact regions 376 are substantially identical, the dopant and dopant concentration profile for the source regions 316 and 326 are substantially identical, the composition and thickness of the gate dielectric layer 384 are substantially the same and uniform, respectively, and the composition and thickness of the gate electrodes 314 and 324 are substantially identical. Regarding electrical parameters for the transistors 110 and 120, $R_{DSON\_SPECIFIC}$ is substantially identical, and channel lengths are substantially identical.

FIG. 3 is referenced with respect to directions in which channel lengths and channel widths for the transistors 110 and 120 are measured. Referring to FIG. 3, for the power transistor 110, the channel length is the distance between either of the source regions 316 to the semiconductor layer 304 as measured along the major surface 306, and for the SenseFET 120, the channel length is the distance between either of the source regions 326 to the semiconductor layer 304 as measured along the major surface 306. The channel widths are measured in a direction perpendicular to the channel lengths, and thus, measured in a direction that is into and out of the drawing sheet for FIG. 3 (not measured in the vertical direction as illustrated in FIG. 3).

For the transistors 110 and 120, other than areas and channel widths, to the extent that any of the foregoing parameters are not identical or the same, any difference may be due to manufacturing tolerances when fabricating the die, and such difference will be less than 10%. The transistors 110 and 120 can be fabricated in the same die to ensure that each of the foregoing parameters are as close to each other as reasonably practicable. The relationships between effective channel widths for the transistors 110 and 120 and between the areas occupied by the transistors 110 and 120 are described above.

In theory, the protection transistor 130, the resistor 140, and the diodes 150 and 160 may be on a die different from the die that includes the transistors 110 and 120. In practice, the circuit 100 should react as quickly as reasonably possible to limit current flow through the power transistor 110. Thus, a single die can include the transistors 110, 120, 130, the resistor 140, and the diodes 150 and 160. Any or all of the resistor 140 and the diodes 150 and 160 may be formed at least partly from a part of the semiconductor layer 304 or the body regions 374. Any or all of the resistor 140 and the diodes 150 and 160 may be a thin-film circuit element formed external to the semiconductor layer 304 and the body regions 374.

Figure 4:
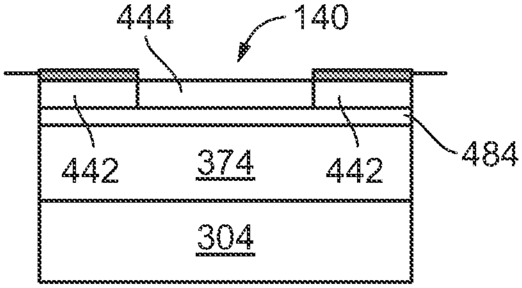
FIG. 4 includes an illustration of a cross-sectional view of a portion of the die of FIG. 2 including a thin-film resistor.

FIG. 4 includes a cross-sectional view of a portion of the die where the resistor 140 is a thin-film resistor formed over a dielectric layer 484 that electrically isolates the resistor from the body region 374. The thin-film resistor can be formed from a portion of the gate conductive layer used to form the gate electrodes 324, 324, and 334. In another implementation, the thin-film resistor can be formed from a layer of semiconductor material, such as a layer of polySi or another semiconductor material. The resistor 140 can include a body portion 444 and terminals 442. The terminals 442 and the body portion 444 can have the same conductivity type. If formed from a layer of semiconductor material, the terminals 442 can have an average dopant concentration of at least $5\times10^{18}$ atoms/$cm^3$. Thus, ohmic contacts can be made between the terminals 442 and a metal-containing material (illustrated by dark bands) overlying the terminal 442. The terminals 442 may have an average dopant concentration of at most $3\times10^{21}$ atoms/$cm^3$. The body portion 444 of the resistor 140 may have an average dopant concentration that is the same or less than the average dopant concentration of the terminals 442. The thickness of the layer used to form the resistor 140, the average dopant concentrations of the terminals 442 and the body portion 444, and the geometry of the resistor (as seen from a top view) can be selected to achieve a desired resistance for the resistor 140.

In an alternative implementation, the resistor 140 can be formed in the monocrystalline semiconductor base material where the body region 374 is formed. The structure and average dopant concentrations can be the same as previously described with respect to the thin-film resistor in FIG. 4.

Figure 5:
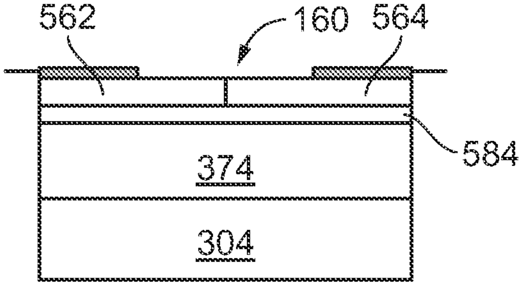
FIG. 5 includes an illustration of a cross-sectional view of a portion of the die of FIG. 2 including a blocking diode in accordance with an implementation.

The blocking diode 160 can be a thin-film diode. A semiconductor layer, such as a layer of polySi, can be deposited over a dielectric layer 584 that electrically isolates the blocking diode 160 from the body region 374. Referring to FIG. 5, the semiconductor layer can be doped to form an n-type cathode region 562 and a p-type anode region 564. Metal contacts (illustrated with dark bands) to the regions 562 and 564 are ohmic contacts. If the dopant concentration within the cathode region 562, the anode region 564, or both regions are insufficient to form a ohmic contact, a heavily doped region having the same conductivity type as the anode or cathode region in which it resides can be formed under and in contact with the metal contacts in a manner similar to the terminals 442 of the resistor 140. If needed or desired, the protection diode 150 can be a thin-film diode similar to the blocking diode 160.

Figure 6:
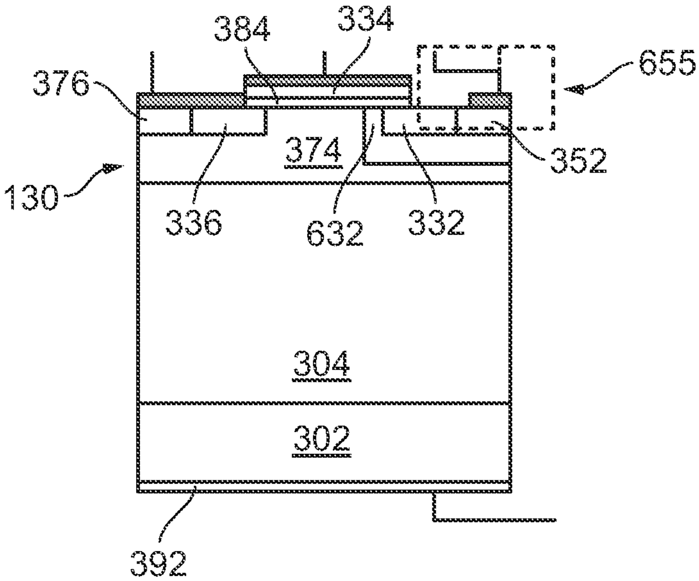
FIG. 6 includes an illustration of a cross-sectional view of a portion of the die of FIG. 2 including a protection transistor and blocking and protection diodes.

In another implementation, both of the diodes 150 and 160 can be formed within the monocrystalline semiconductor material that may include part of the active region of the protection transistor 130. In the same or different implementation, the diodes 150 and 160 can be integrated into the design of the protection transistor 130, as illustrated by the dashed line 655 in FIG. 6 and top views in FIGS. 7 and 8. When comparing FIG. 6 to FIG. 3, a metal contact is not made to the drain region 332 in FIG. 6, whereas a contact is made to the drain region 332 in FIG. 3. In FIG. 6, current can flow through the diodes 150 and 160 before reaching the drain region 332 when the diodes 150 and 160 are forward biased.

The protection transistor 130 further includes a well region 632 to isolate the diodes within dashed line 655 from the body region 374. The well region 632 has a conductivity type opposite the conductivity type of the body region 374. In an implementation, the well region 632 has an n-type conductivity type. The average dopant concentration of the well region 632 can be selected to provide desired breakdown characteristics of either or both of the diodes 150 and 160. In an implementation, the average dopant concentration of the well region 632 is less than the average dopant concentration of the drain region 332. In the same or different implementation, the average dopant concentration of the well region 632 is greater than the average dopant concentration of the body region 374. In either or both of the previous implementations or in a different implementation, the well region 632 has an average dopant concentration in a range from $5\times10^{16}$ atoms/cm$^3$ to $2\times10^{18}$ atoms/cm$^3$.

Figure 7:
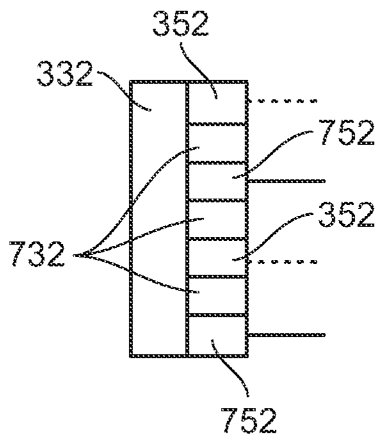
FIG. 7 includes an illustration of a top view of an enlarged portion of the die in FIG. 6 including a physical design for the blocking and protection diodes in accordance with an implementation.

FIG. 7 includes a top view of a portion of the diodes 150 and 160 that are within the dashed line 655 in FIG. 6. In the implementation illustrated in FIG. 7, the drain region 332 of the protection transistor 130 is adjacent to the anode regions 352 of the protection diode 150, anode regions 752 of the blocking diode 160, and portions 732 of the well region 632 (FIG. 6) that are located between pairs of anode regions 352 and 752. In this implementation, the diodes 150 and 160 are pn diodes. The dashed lines extending from the right-hand sides of the anode regions 352 of the protection diode 150 represent electrical coupling to the source region 336 of the protection transistor 130. The solid lines extending from the right-hand sides of the anode regions 752 of the blocking diode 160 represent electrical coupling to the gate electrodes 314 and 324 of the power 110 and the SenseFET transistor 120, respectively.

Figure 8:
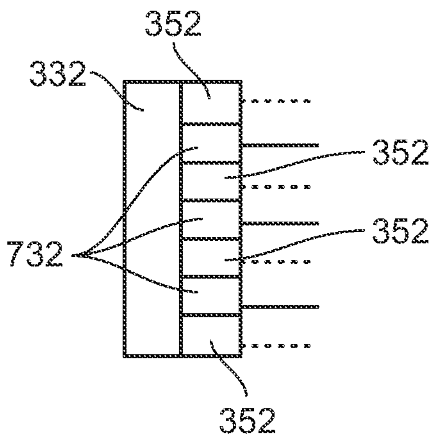
FIG. 8 includes an illustration of a top view of an enlarged portion of the die in FIG. 6 including a physical design for the blocking and protection diodes in accordance with another implementation.

In another implementation, the blocking diode 160 can be a Schottky diode instead of a pn diode. FIG. 8 includes a top view of a portion of the diodes 150 and 160 that are within the dashed line 655 in FIG. 6. In the implementation illustrated in FIG. 8, the anode regions 752 are no longer present, and metal connections are made to portions 732 of the well region 632 (FIG. 6) that are located between pairs of anode regions 352. The portions 732 are cathode regions and the metal that contacts the portions 732 are anodes for the blocking diode 160 in this implementation. The contacts between the portions 732 and the metal are Schottky contacts. The dashed lines extending from the right-hand sides of the anode regions 352 of the protection diode 150 represent electrical coupling to the source region 336 of the protection transistor 130. The solid lines extending from the right-hand sides of the portions 732 represent electrical coupling to the gate electrodes 314 and 324 of the power and SenseFET transistors 110 and 120, respectively.

As illustrated in FIGS. 7 and 8, the diodes 150 and 160 have a side-by-side design. Referring to FIG. 7, the anode regions 352 for the protection diode 150 and the anode regions 752 for the blocking diode 160 alternate with each other. Referring to FIG. 8, the anode regions 352 for the protection diode 150 and the portions 732 (cathode regions) for the blocking diode 160 alternate with each other. The side-by-side design can help to reduce the area occupied by the diodes 150 and 160.

Figure 9:
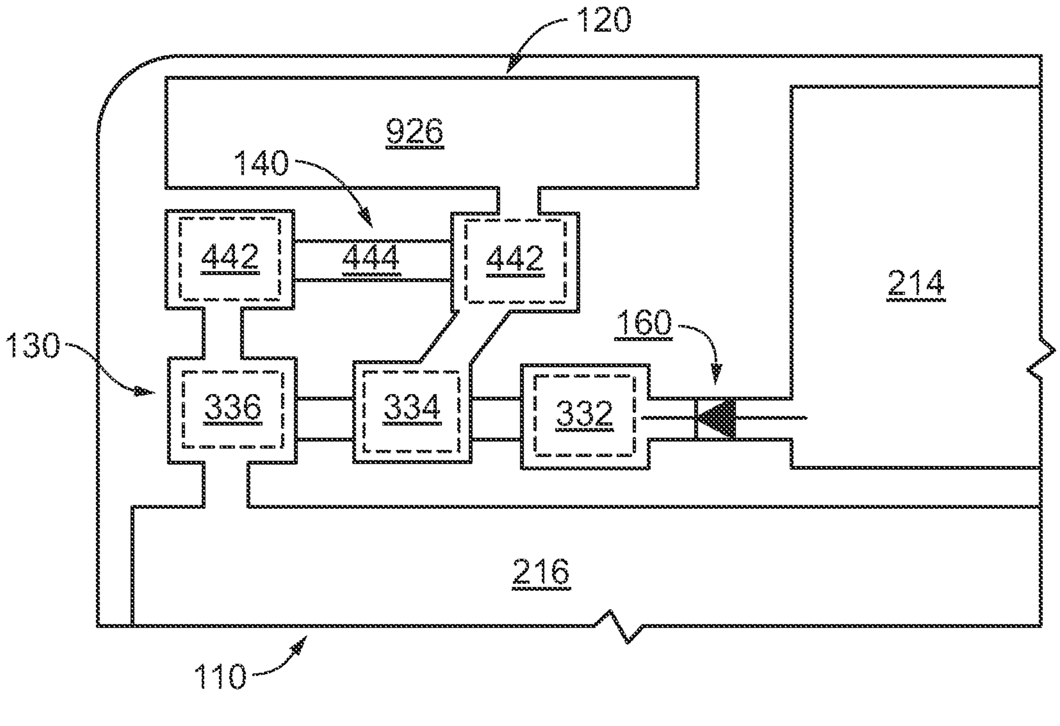
FIG. 9 includes a schematic illustration of a top view of an enlarged portion of the die of FIG. 2 in accordance with an implementation.

FIG. 9 includes an enlarged top view of a portion of the die 200 (FIG. 2) that provides an exemplary, non-limiting physical design illustrating positions and interconnection of components and terminal pads 214, 216, and 926. The actual size of components can be different from what is illustrated. For example, the area occupied by the SenseFET 120 can be significantly larger as compared to the illustration in FIG. 9, and the areas occupied by the protection transistor 130 and the resistor 140 can be significantly smaller as compared to the illustration in FIG. 9. The blocking diode 160 may occupy a small area and may be a pn diode or a Schottky diode. The protection diode 150 is present but is not illustrated in FIG. 6. In FIG. 9, features that are overlapped by portions of the terminal pads 214, 216, and 926 are illustrated with dashed lines.

The source pad 216 contacts source regions 316 of the power transistor 110. A portion of the source pad 216 extends over and contacts the source region 336 of the protection transistor 130 and a terminal 442 of the resistor 140. The source pad 926 contacts source regions 326 of the SenseFET 120. A portion of the source pad 926 extends over and contacts the other terminal 442 of the resistor 140 and the gate electrode 334 of the protection transistor 130. The body portion 444 of the resistor 140 is illustrated between terminals 442.

The gate pad 214 is electrically coupled to gate electrodes of the power transistor 110 and the SenseFET 120. The gate electrodes of the power transistor 110 and the SenseFET 120 extend under the source pads 216 and 926 and coupled to the gate pad 214. A portion of the gate pad 214 extends over and is electrically coupled to the drain region 332 of the protection transistor 130 via the blocking diode 160.

Many other designs are possible without deviating from the concepts as described herein. In another implementation, the power transistor 110 and the SenseFET 120 can be replaced by vertical transistors having gate trenches with a gate dielectric layer and gate electrodes within the gate trenches. The concepts can be extended to another power transistor design, such as IGBTs that can be used for the power transistor 110 and the SenseFET 120. Similar to the IGFETs illustrated in the figures, the IGBTs for the transistors 110 and 120 will be substantially identical to each other except for the area occupied by the IGBTs and the effective channel width. Similar to the design with the IGFETs, the design with the IGBTs will allow the circuit to react quicker as compared to conventional protected IGBTs.

Many different aspects and implementations are possible. Some of those aspects and implementations are described below. After reading this specification, skilled artisans will appreciate that those aspects and implementations are only illustrative and do not limit the scope of the present invention. Implementations may be in accordance with any one or more of the implementations as listed below.

Implementation 1. An electronic device can include a first transistor including a drain region, a source region, and a gate electrode; a second transistor including a drain region, a source region, and a gate electrode; a third transistor including a source region and a gate electrode; and a resistor including a first terminal and a second terminal. Each of the first transistor and the second transistor is an insulated-gate field-effect transistor. The drain region of the first transistor and the drain region of the second transistor are electrically coupled to each other, the gate electrode of the first transistor and the gate electrode of the second transistor are electrically coupled to each other, the source region of the first transistor, the source region of the third transistor, and the first terminal of the resistor are electrically coupled to one another, and the source region of the second transistor, the gate electrode of the third transistor, and the second terminal of the resistor are electrically coupled to one another.

Implementation 2. The electronic device of Implementation 1 further includes a first diode including a cathode electrically coupled to a drain region of the third transistor.

Implementation 3. The electronic device of Implementation 2, wherein the first diode has a breakdown voltage of at most 50 V.

Implementation 4. The electronic device of Implementation 3, wherein the first transistor is adapted to turn on at a Vos that is lower than the breakdown voltage of the first diode.

Implementation 5. The electronic device of Implementation 2 further includes a second diode including an anode and a cathode. The anode of the second diode is electrically coupled to the gate electrode of the first transistor, the cathode of the second diode is electrically coupled to the drain region of the third transistor, and an anode of the first diode is electrically coupled to the source region of the third transistor.

Implementation 6. The electronic device of Implementation 5, wherein the first diode and the second diode has a side-by-side design.

Implementation 7. The electronic device of Implementation 2, wherein the first diode includes a Si semiconductor base material.

Implementation 8. The electronic device of Implementation 2, wherein the first diode is a pn diode.

Implementation 9. The electronic device of Implementation 2, wherein the first diode is a Schottky diode.

Implementation 10. The electronic device of Implementation 1, wherein the first transistor occupies a first area, the second transistor occupies a second area that is less than 10% of the first area.

Implementation 11. The electronic device of Implementation 1, wherein the third transistor has an on-state resistance in a range from 0.1 ohm to 100 ohms.

Implementation 12. The electronic device of Implementation 1, wherein the resistor has a resistance in a range of 1 ohm to 100 ohms.

Implementation 13. The electronic device of Implementation 1, wherein an active region of the first transistor and an active region of the second transistor include a SiC semiconductor base material.

Implementation 14. The electronic device of Implementation 1, wherein the drain region of the third transistor is electrically coupled to the gate electrode of the first transistor and the gate electrode of the second transistor.

Implementation 15. The electronic device of Implementation 1, wherein the third transistor is a lateral transistor.

Implementation 16. An electronic device can include a first transistor including a drain region, a source region, and a gate electrode; a second transistor including a drain region, a source region, and a gate electrode; a third transistor including a drain region, a source region, and a gate electrode; a resistor including a first terminal and a second terminal; a first diode including an anode and a cathode; and a second diode including an anode and a cathode. Each of the first transistor and the second transistor is an insulated-gate field-effect transistor having a SiC semiconductor base material, and the third transistor is a lateral insulated-gate field-effect transistor. The drain region of the first transistor and the drain region of the second transistor are electrically coupled to each other, the gate electrode of the first transistor, the gate electrode of the second transistor, and the anode of the first diode are electrically coupled to one another, the source region of the first transistor, the source region of the third transistor, the anode of the second diode, and the first terminal of the resistor are electrically coupled to one another, the source region of the second transistor, the gate electrode of the third transistor, and the second terminal of the resistor are electrically coupled to one another, and the drain region of the third transistor, the cathode of the first diode, and the cathode of the second diode are electrically coupled to one another.

Implementation 17. A circuit can include a first transistor including a drain, a source, and a gate; a second transistor including a drain, a source, and a gate; a third transistor including a drain, a source, and a gate; and a resistor including a first terminal and a second terminal. Each of the first transistor and the second transistor is an insulated-gate field-effect transistor. The drain of the first transistor and the drain of the second transistor are electrically coupled to each other, the gate of the first transistor and the gate of the second transistor are electrically coupled to each other, the source of the first transistor, the source of the third transistor, and the first terminal of the resistor are electrically coupled to one another, and the source of the second transistor, the gate of the third transistor, and the second terminal of the resistor are electrically coupled to one another.

Implementation 18. The circuit of Implementation 17 further includes a diode having a cathode and an anode. The anode of the diode and the source of the third transistor are electrically coupled to each other, and the cathode of the diode and the drain of the third transistor are electrically coupled to each other.

Implementation 19. The circuit of Implementation 17 further includes a diode having a cathode and an anode. The anode of the diode and the gate of the first transistor are electrically coupled to each other, and the cathode of the diode and the drain of the third transistor are electrically coupled to each other.

Implementation 20. The circuit of Implementation 17 further includes a drain terminal, a source terminal, and a gate terminal. The drain terminal is electrically coupled to the drain of the first transistor and the drain of the third transistor, the source terminal is electrically coupled to the source of the first transistor and the source of the third transistor, and the gate terminal is electrically coupled to the gate of the first transistor and the gate of the second transistor.

EXAMPLES

The circuit and physical designs as described herein can react quickly to an over-current event and lower the maximum drain current during the event as compared to a power transistor without the protection features. The examples are meant to improve understanding of the concepts described herein and not to limit the inventive concepts.

Simulations were performed on three different designs:

Control (C)—the power transistor 110 by itself (not within the circuit 100);

AR1—the circuit 100 with a particular area for the SenseFET 120 and resistance for the resistor 140; and AR2—the circuit 100 with a different area for the SenseFET 120 and a different resistance for the resistor 140. When comparing AR1 and AR2, the AR2 design has twice as much area occupied by the SenseFET 120 and twice as much resistance for the resistor 140.

The conditions for the simulation were as follows:

Vin=400 V, which is a constant voltage difference between power supply output and ground electrically coupled to the drain terminal 102 and the source terminal 106;

Vdr=−3/18 V, which is a pulsed voltage applied between the gate terminal 104 and the source terminal 106, where the voltage is pulsed between −3 V when off and 18 V when on;

Rgon=10Ω, which is the turn-on gate resistance between the gate terminal 104 and a driver when the power transistor 110 is being turned on;

Rgoff=10Ω, which is the turn-on gate resistance between the gate terminal 104 and a driver when the power transistor 110 is being turned off; and Tsc=3.0 μs, which is the time period when the driver voltage is high.

The power transistor 110 (control) and the circuit 100 for the AR1 and AR2 designs were at room temperature (20° C. to 25° C.) for the simulation.

Figure 10:
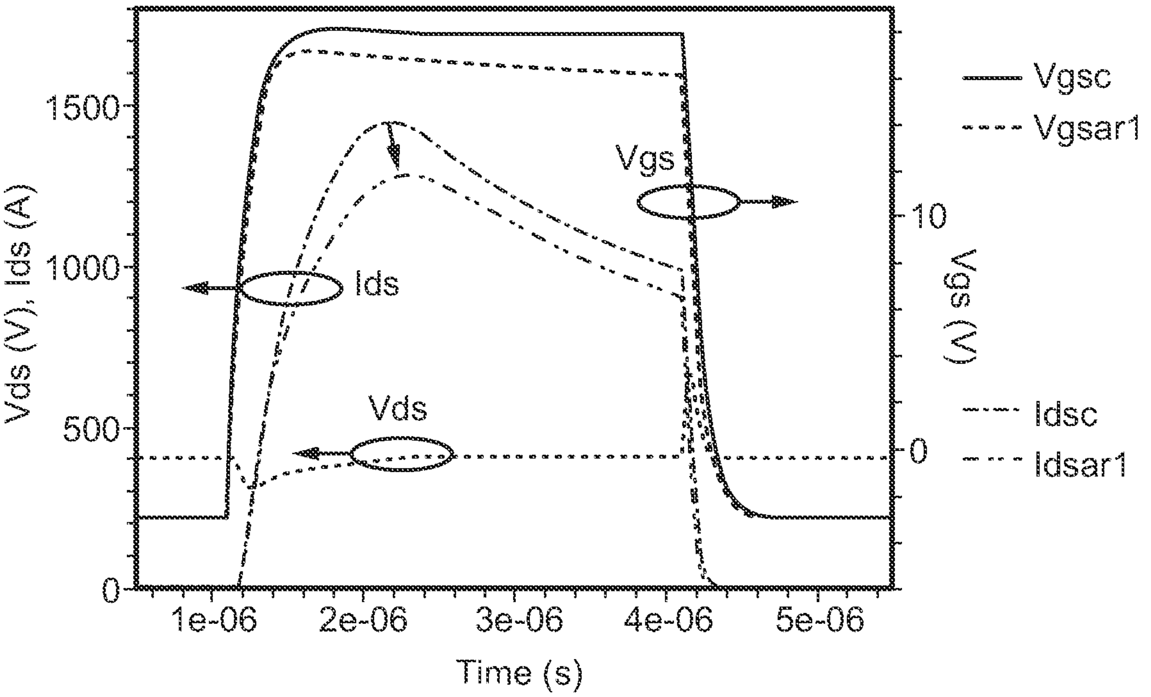
FIG. 10 includes plots of electrical parameters as a function of time during a short-circuit event for a power transistor with and without the other electrical circuit elements in FIG. 1.

FIG. 10 compares the control to the AR1 design for the circuit 100. Vgsc is the gate-to-source voltage for the control, Vgsar1 is the gate-to-source voltage for the AR1 design, Idsc is the drain-to-source current for the control, and Idsar1 is the drain-to-source current for the AR1 design. As can be seen in FIG. 10, the circuit 100 reacts in less than 0.5 μs as evidenced by reducing Vgs, limiting current Ids, and dissipated energy for the AR1 design when compared to the control. The maximum Ids for the AR1 design is approximately 200 A less as compared the control.

Figure 11:
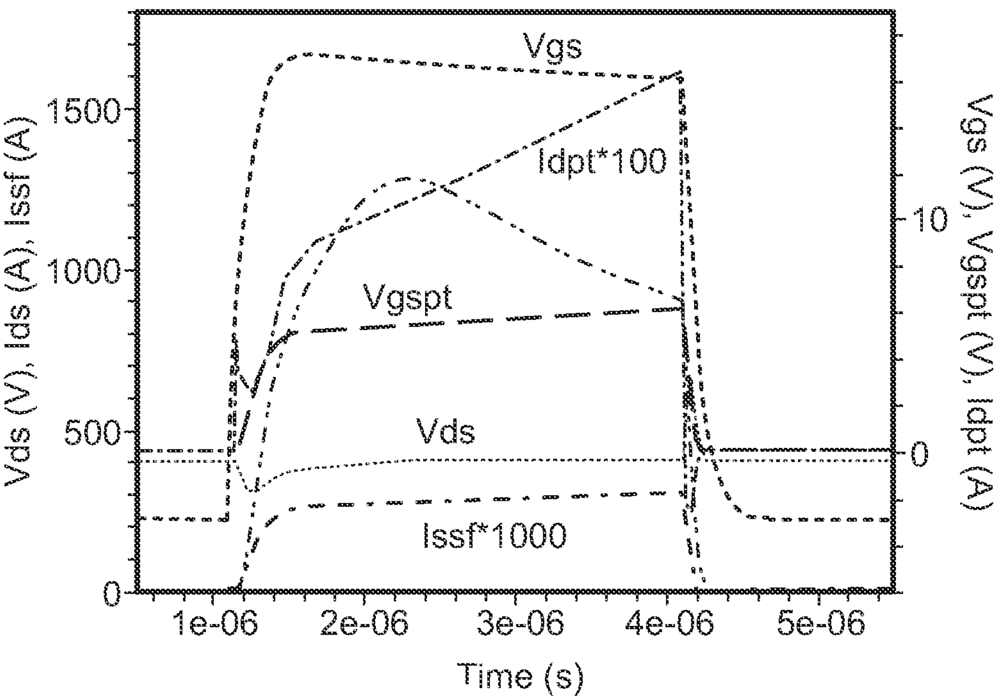
FIG. 11 includes plots of electrical parameters as a function of time during a short-circuit event for the SenseFET and the protection transistor in FIG. 1.

FIG. 11 includes more electrical parameters for electrical circuit members within the AR1 design. In FIG. 11, Idpt is the drain current for the protection transistor 130, and Vgspt is the gate-to-source voltage for the protection transistor 130, and Issf is the source current for the SenseFET 120. When the protection transistor 130 turns on, current flows through the protection transistor and lowers the gate-to-source voltage for the power transistor 110 and the SenseFET 120.

Figure 12:
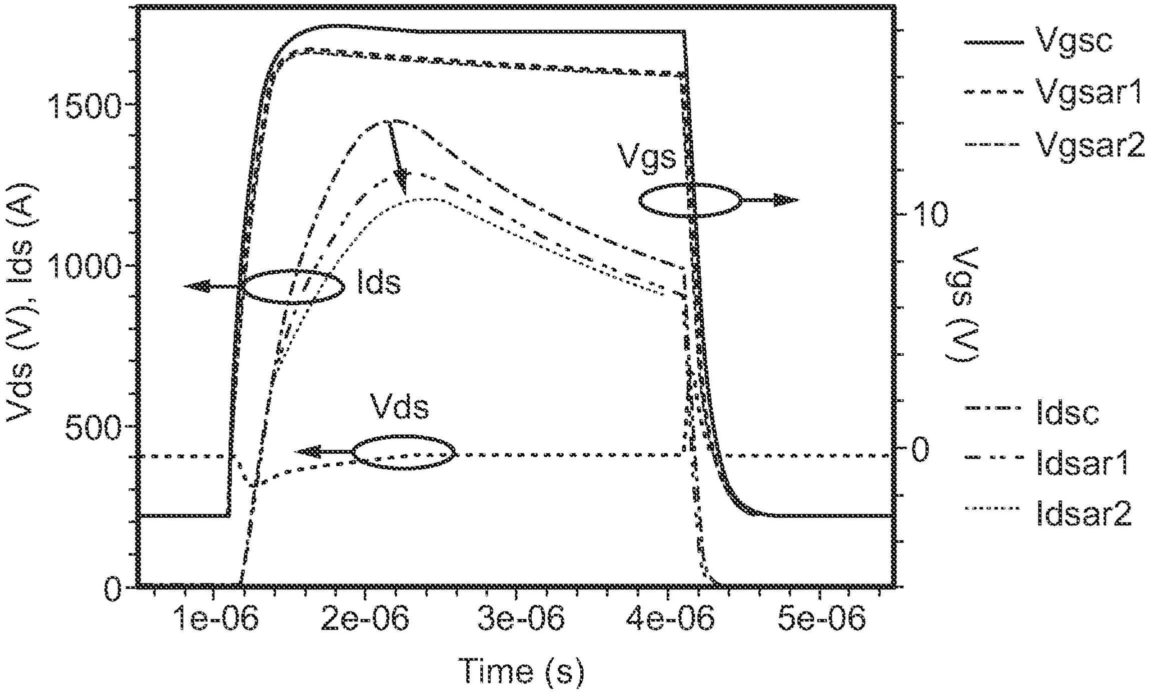
FIG. 12 includes plots of electrical parameters as a function of time during a short-circuit event for (1) a power transistor without the other electric circuit elements in FIG. 1, (2) a power transistor with the other electrical circuit elements in FIG. 1 in accordance with an implementation, and (3) a power transistor with the other electrical circuit elements in FIG. 1 in accordance with another implementation.

FIG. 12 compares the control to the AR1 and AR2 designs for the circuit 100. Vgsar2 is the gate-to-source voltage for the AR2 design, and Idsar2 is the drain-to-source current for the AR2 design. Similar to the AR1 design, the circuit 100 with the AR2 design reacts in less than 0.5 μs as evidenced by reducing Vgs, limiting current Ids, and dissipated energy for the AR2 design when compared to the control. The maximum Ids for the AR2 design is approximately 300 A less as compared the control. The further reduction in maximum Ids comes at a cost because the SenseFET 120 in the AR2 design occupies twice as much area as the SenseFET 120 in the AR1 design. After reading this specification, skilled artisans will be able to determine an area for the SenseFET 120 that achieves a sufficient reduction in Ids for the circuit 100 to meet the needs or desires for a particular application.

The circuit and the electronic device including the circuit can allow a power transistor to be better protected from over-current, e.g., during a short-circuit event. An electronic device including the circuit can react to a short-circuit event in less than 0.5 μs. The circuit includes a SenseFET where the effective channel width and area occupied by the SenseFET can be selected to provide an acceptable reduction in maximum drain current without occupying too much area of the die, so that the power transistor can provide most of the current flowing through the circuit. The electronic device including the circuit is well suited for use in applications where over-current events, such as short circuit events, are possible, such as in, but not limited to, inverters in electric vehicles.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific implementations. However, the benefits, advantages, solutions to problems, and any feature(s) that may cause any benefit, advantage, or solution to occur or become more pronounced are not to be construed as a critical, required, or essential feature of any or all the claims.

The specification and illustrations of the implementations described herein are intended to provide a general understanding of the structure of the various implementations. The specification and illustrations are not intended to serve as an exhaustive and comprehensive description of all of the elements and features of apparatus and systems that use the structures or methods described herein. Separate implementations may also be provided in combination in a single implementation, and conversely, various features that are, for brevity, described in the context of a single implementation, may also be provided separately or in any subcombination. Further, reference to values stated in ranges includes each and every value within that range. Many other implementations may be apparent to skilled artisans only after reading this specification. Other implementations may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device, comprising:

a first transistor including a drain region, a source region, and a gate electrode;

a second transistor including a drain region, a source region, and a gate electrode;

a third transistor including a source region and a gate electrode; and a resistor including a first terminal and a second terminal, wherein:

each of the first transistor and the second transistor is an insulated-gate field-effect transistor, an active region of the first transistor and an active region of the second transistor include a SiC semiconductor base material, the drain region of the first transistor and the drain region of the second transistor are electrically coupled to each other, the gate electrode of the first transistor and the gate electrode of the second transistor are electrically coupled to each other, the source region of the first transistor, the source region of the third transistor, and the first terminal of the resistor are electrically coupled to one another, and the source region of the second transistor, the gate electrode of the third transistor, and the second terminal of the resistor are electrically coupled to one another.

2. The electronic device of claim 1, further comprising:

a first diode including a cathode electrically coupled to a drain region of the third transistor.

3. The electronic device of claim 2, wherein the first diode has a breakdown voltage of at most 50 V.

4. The electronic device of claim 3, wherein the first transistor is adapted to turn on at a $V_{GS}$ that is lower than the breakdown voltage of the first diode.

5. The electronic device of claim 2, further comprising:

a second diode including an anode and a cathode, wherein:

the anode of the second diode is electrically coupled to the gate electrode of the first transistor, the cathode of the second diode is electrically coupled to the drain region of the third transistor, and an anode of the first diode is electrically coupled to the source region of the third transistor.

6. The electronic device of claim 5, wherein the first diode and the second diode has a side-by-side design.

7. The electronic device of claim 2, wherein the first diode includes a Si semiconductor base material.

8. The electronic device of claim 2, wherein the first diode is a pn diode.

9. The electronic device of claim 2, wherein the first diode is a Schottky diode.

10. The electronic device of claim 1, wherein the first transistor occupies a first area, the second transistor occupies a second area that is less than 10% of the first area.

11. The electronic device of claim 1, wherein the third transistor has an on-state resistance in a range from 0.1 ohm to 100 ohms.

12. The electronic device of claim 1, wherein the resistor has a resistance in a range of 1 ohm to 100 ohms.

13. The electronic device of claim 1, wherein the drain region of the third transistor is electrically coupled to the gate electrode of the first transistor and the gate electrode of the second transistor.

14. The electronic device of claim 1, wherein the third transistor is a lateral transistor.

15. An electronic device, comprising:

a first transistor including a drain region, a source region, and a gate electrode;

a second transistor including a drain region, a source region, and a gate electrode;

a third transistor including a drain region, a source region, and a gate electrode;

a resistor including a first terminal and a second terminal;

a first diode including an anode and a cathode; and a second diode including an anode and a cathode, wherein:

each of the first transistor and the second transistor is an insulated-gate field-effect transistor having a SiC semiconductor base material, the third transistor is a lateral insulated-gate field-effect transistor, the drain region of the first transistor and the drain region of the second transistor are electrically coupled to each other, the gate electrode of the first transistor, the gate electrode of the second transistor, and the anode of the first diode are electrically coupled to one another, the source region of the first transistor, the source region of the third transistor, the anode of the second diode, and the first terminal of the resistor are electrically coupled to one another, the source region of the second transistor, the gate electrode of the third transistor, and the second terminal of the resistor are electrically coupled to one another, and the drain region of the third transistor, the cathode of the first diode, and the cathode of the second diode are electrically coupled to one another.

16. A circuit, comprising:

a first transistor including a drain, a source, and a gate;

a second transistor including a drain, a source, and a gate;

a third transistor including a drain, a source, and a gate;

a first diode including a cathode; and a resistor including a first terminal and a second terminal, wherein:

each of the first transistor and the second transistor is an insulated-gate field-effect transistor, the drain of the first transistor and the drain of the second transistor are electrically coupled to each other, the gate of the first transistor and the gate of the second transistor are electrically coupled to each other, the source of the first transistor, the source of the third transistor, and the first terminal of the resistor are electrically coupled to one another, the source of the second transistor, the gate of the third transistor, and the second terminal of the resistor are electrically coupled to one another, the cathode of the first diode is electrically coupled to a drain region of the third transistor, and the first diode has a breakdown voltage of at most 50 V.

17. The circuit of claim 16, wherein an anode of the first diode and the source of the third transistor are electrically coupled to each other.

18. The circuit of claim 17, further comprising:

a second diode having an anode and a cathode, wherein:

an anode of the first diode and the gate of the first transistor are electrically coupled to each other, and the cathode of the second diode and the drain of the third transistor are electrically coupled to each other.

19. The circuit of claim 16, wherein an anode of the first diode and the gate of the first transistor are electrically coupled to each other.

20. The circuit of claim 16, further comprising a drain terminal, a source terminal, and a gate terminal, wherein:

the drain terminal is electrically coupled to the drain of the first transistor and the drain of the third transistor, the source terminal is electrically coupled to the source of the first transistor and the source of the third transistor, and the gate terminal is electrically coupled to the gate of the first transistor and the gate of the second transistor.

* * * * *